(12) United States Patent
Monge-Navarro et al.

(10) Patent No.: US 6,370,367 B1
(45) Date of Patent: *Apr. 9, 2002

(54) METHOD FOR IMPROVING THE QUALITY OF RECEPTION IN A RADIO RECEIVER AND A RADIO RECEIVER

(75) Inventors: Alejandro Monge-Navarro, Salo; Pekka Mellanen, Marttila; Ari Heikkinen, Salo, all of (FI)

(73) Assignee: Nokia Mobile Phones Ltd., Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/876,674

(22) Filed: Jun. 16, 1997

(30) Foreign Application Priority Data

Jun. 17, 1996 (FI) .................................................. 962509

(51) Int. Cl.[7] .............................................. H04B 17/00
(52) U.S. Cl. ................... 455/226.1; 455/67.3
(58) Field of Search ......................... 455/62, 63, 67.3, 455/226.1, 226.2, 161.1–161.2, 179.1, 182.1–182.3, 192.1–193.3, 31.2, 38.1, 254.55, 257, 265–266, 268; 340/825.44; 375/346, 344, 326

(56) References Cited

U.S. PATENT DOCUMENTS

| | | | |
|---|---|---|---|
| 5,148,548 A | * 9/1992 | Meche et al. ........... 455/67.3 X |
| 5,438,688 A | 8/1995 | Masaki .................... 455/161.2 |
| 5,465,410 A | * 11/1995 | Hiben et al. ................ 455/266 |
| 5,479,452 A | 12/1995 | Hayes et al. ................ 375/344 |
| 5,630,218 A | * 5/1997 | Muto ....................... 455/226.2 |
| 5,726,978 A | * 3/1998 | Frodigh et al. ........... 455/63 X |
| 5,758,271 A | * 5/1998 | Rich et al. ................ 455/234.1 |
| 5,875,388 A | * 2/1999 | Daughtry et al. .......... 455/67.1 |
| 5,940,747 A | * 8/1999 | Groghans et al. ........ 455/168.1 |
| 5,960,335 A | * 9/1999 | Umemoto et al. ....... 455/226.2 |

FOREIGN PATENT DOCUMENTS

| | | |
|---|---|---|
| EP | 0275527 A1 | 7/1988 |
| EP | 0558903 A1 | 9/1993 |

OTHER PUBLICATIONS

Finnish Official Action.
Patent Abstracts of Japan, vol. 096, No. 003, Mar. 1996, & JP 07 297779 A, Nov. 1995.

* cited by examiner

Primary Examiner—Nay Maung
(74) Attorney, Agent, or Firm—Perman & Green, LLP

(57) ABSTRACT

A receiving device, the signal received by which has at least one digital data channel, demodulates (1) and decodes (4) the digital data included in the data channel and measures (7) its quality as well on the frequency to be used and at least on one further frequency. The parameter describing the bit error ratio and/or the quantity of correctly received code words will be delivered to a controller (6) that makes the decision whether the tuning frequency of the radio receiving (1) part included in the device should be changed.

12 Claims, 2 Drawing Sheets

METHOD FOR IMPROVING THE QUALITY OF RECEPTION IN A RADIO RECEIVER AND A RADIO RECEIVER

BACKGROUND OF THE INVENTION

1. Field of the Invention

The present invention concerns in general improving the quality of reception in a radio receiver and especially an adaptive equalization in order to tune the radio receiver on such a frequency that the quality of the received signal is the best possible.

2. Description of the Prior Art

The receiving of radio broadcast suffers from interference caused by the frequency shift and broadening, other radio broadcasts on the same and adjacent channels and other electromagnetic radiation sources. In the receiver the interferences show themselves as noise and signal distortions. Especially in the digital radio broadcast, where the modulation is based on a digital signal to be transmitted, the interferences produce bit errors, that is, the receiver does not interpret the bits transferred by the signal correctly. A digital receiver can analyze after the decoding the data received by it, if there are redundancy or certain checksums attached to it, and if necessary, abandon the incorrect parts of the data. This causes, however, ineffectiveness of the data transfer, so that it would be better, if the receiver could be tuned so that it could already in the receiving phase decrease the influence of the interferences. The problem is complicated by the fact that the interferences are mostly temporally variable, particularly in cases of mobile terminal devices.

In addition to external interference factors, the need for frequency tuning is influenced by the internal factors of the receiver, like aging of the components, manufacturing tolerances, temperature drift, intermodulation frequencies and so forth.

Known in the art there is a method called AFC (Automatic Frequency Control), wherein the receiver includes an adjustable mixer frequency oscillator, a testing circuit for measuring the received signal power and a feedback loop that adjusts the oscillator so that mixing to the intermediate frequency always happens by using the mixer frequency that produces the strongest possible signal power. A disadvantage of this method is that the strongest received signal power doesn't always correspond to the best signal quality e.g. in a situation where the receiver, in addition to the desired signal, also captures an undesirable transmission on the same or a very close frequency. The tuned frequency sets itself so that attenuation of the intermediate frequency path is the smallest possible. If the transmission characteristics of the filters are not symmetrical (in other words, the attenuation minimum in the middle of the pass band), the intermediate frequency is tuned aside, even though the receiver would not receive anything else but the intended transmission. The tolerances of the filters and their adjustment circuits can cause even a significant lateral deviation, whereby the received signal is distorted, that is, its quality is deteriorated.

Another known method is to use a frequency synthesizer, in other words, a very accurately tunable mixer oscillator, the mixer frequency produced by which is some multiple of the basic frequency produced by the crystal oscillator. As the mixer frequency remains accurately the same, the receiving filter can be constructed to have a very narrow band, whereby the influence of the interferences propagating on other frequencies is decreased. A disadvantage of this method is that if the transmitter or the receiver or some factor reflecting the signal moves, the frequency of the desired signal does not keep stable but changes, whereby it can be driven outside the narrow pass band of the filter. Additionally, the tolerances of the filters and matching circuits can cause that the attenuation of the signal path is not at its minimum on the nominal frequency. In that case the signal/noise ratio suffers, that is, the quality of the signal is deteriorated. The method is also sensitive to the changes happening to the characteristics of the components in the course of the time.

One method of prior art is the AGC (Automatic Gain Control) where the signal to be received by the receiver is attenuated in the prestages of the device in cases where the level of the signal to be received is too high. The tuning of the receiver is not changed in the AGC method. In addition, in a double super heterodyne receiver with two intermediate frequencies, it is known to tune the mixer frequency received from the first local oscillator aside, whereby the first intermediate frequency signal sets itself aside. The second mixer frequency received from the local oscillator is also tuned aside, but in such a way that the second intermediate frequency signal is moved in another direction with respect to the nominal frequency than the first intermediate signal. In that case the effective bandwidth through the intermediate frequency phases is narrowed. The narrowing and widening of the band can be based on the level of the received signal or on the signal/noise ratio. The adjustment of the bandwidth and the detection of interferences demand, however, separate components, whereby the production costs are increased.

OBJECTS OF THE INVENTION

An object of the present invention is to provide a method and a device for improving the quality of the digital radio reception compared with the prior art. A further object of the invention is also to provide a method and a device in which the quality improving effect is not significantly dependent on the age of the components or manufacturing tolerances. A still further object of the invention is, that the method and device in accordance with it are suitable for large-scale serial production and have reasonable production costs.

The objects of the invention are attained by measuring the quality of the digital signal decoded in the receiver, and by controlling the selecting of the frequency used for the intermediate frequency mixing so that the frequency producing the best quality is continuously or at least with regular intervals looked for.

The method in accordance with the present invention is characterized in that it consists of the phases where a certain data channel of a received signal, said data channel transferring data in a digital form, is demodulated and decoded, the quality of said data in a digital form is measured on a certain frequency and at least on one further frequency, and decision is made based on the results of the quality measurement, whether the radio receiver part of the receiving device will be further kept tuned on the same frequency, whether it will be tuned on some new frequency, or whether the correctness will be further measured on other frequencies before a decision is made of returning the radio receiver.

The present invention also concerns a device, in which the above described method is used.

A device in accordance with the present invention comprising a radio receiver to be tuned step by step on certain frequencies for receiving and demodulating radio signals, a data decoder for decoding digital data from a demodulated signal, and a controller for processing digital data and for tuning said radio receiver, is characterized in that it further comprises a measuring element for measuring the quality from the decoded digital data and for transmitting a parameter describing said quality to said controller.

In the method in accordance with the present invention, the seeking of the optimal frequency is based on the measurement describing the quality of the received and decoded signal. In case of a digital signal, the most natural way to measure the signal quality is to monitor the quantity of the bit errors occurring in it. The invention does not limit the scale used for the quality evaluation. Most simply, the signal can be either of good or bad quality, whereby there are two steps in the scale. In scales with more steps the signal can be e.g. totally correct, a little faulty, much faulty or useless.

The receiver demodulates and decodes the digital signal received by it and forwards it to the quality measuring element. The quality is measured, in addition to the tuned frequency respectively, also on at least one frequency below and/or above it. In case the signal quality measurement gives bad results, the quality measurements can also be extended farther from the tuned frequency. The receiver selects a new tuned frequency based on certain algorithms, after which the measuring cycle is started from the beginning. The receiver can repeat the measurements continuously or it can perform the measurement at certain intervals.

Although there are different tuning methods based on the quality measurement of the signal, known from the processing of analog signals (among others from the transfer of video and audio signals), the present invention is not obvious based on them, because, for the first, the quality measurement of an analog signal requires equipment of a laboratory level, and secondly, because in that case a special test signal should be transmitted in the signal, in order to make the quality determination possible. Also systems, in which both analog and digital data is transmitted simultaneously, cannot be based on the tuning optimization based on the data signal only, because the demands e.g. for analog video signal transfer are totally different from those for the data transfer.

BRIEF DESCRIPTION OF THE DRAWING

In the following, the present invention will be described in more detail with reference to the illustrated preferred embodiments and the enclosed drawings, wherein.

DETAILED DESCRIPTION OF THE PREFERRED EMBODIMENT(S)

Figure 1:
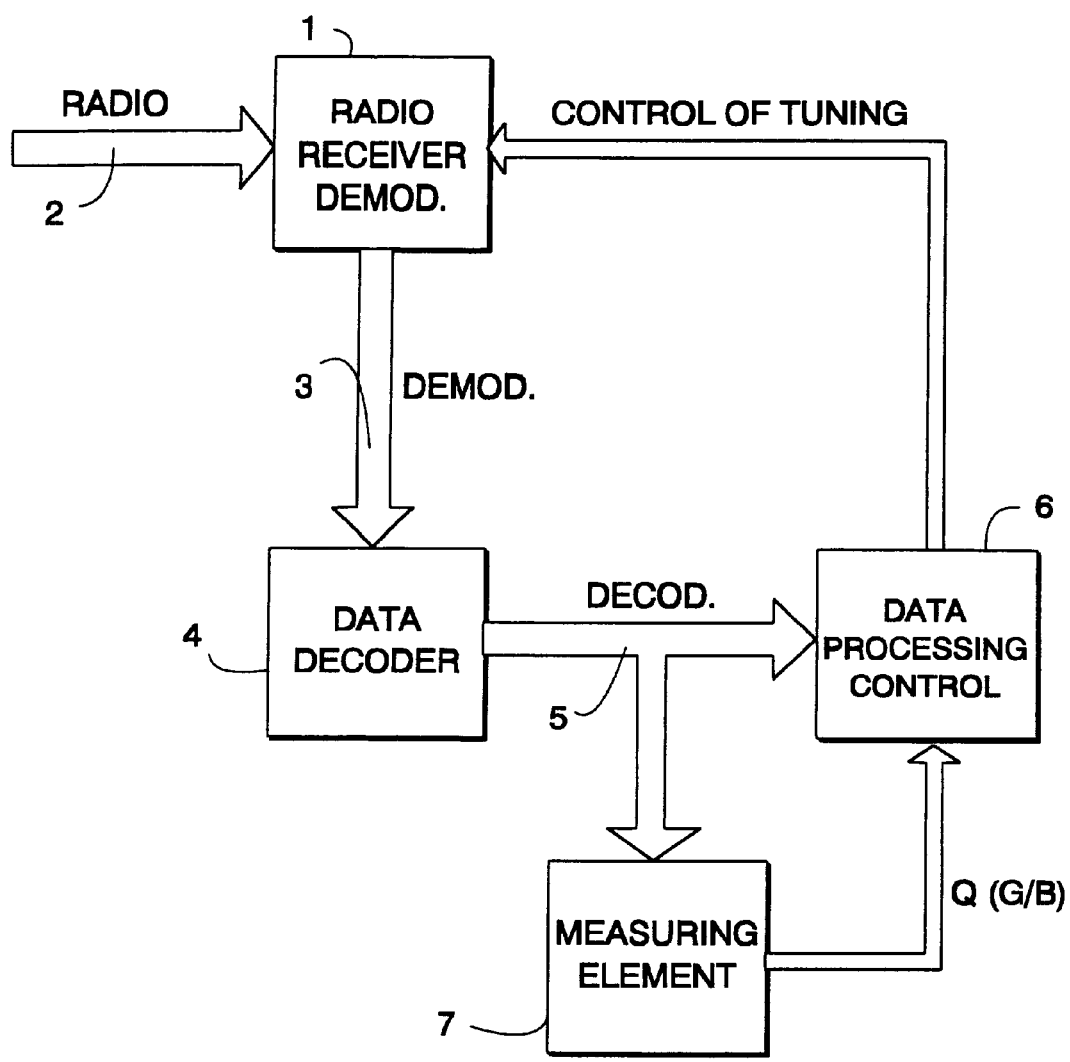
FIG. 1 shows as a block diagram those parts of a receiver in accordance with the invention that are significant for the invention.

Referring to FIG. 1, the first part of the receiver, where the signal is carried to, is radio receiver 1. Signal 2 is a radio frequency signal including at least one digital component, in the following called data channel. Otherwise the invention does not limit the quality of the incoming signal. The radio receiver 1 transforms the signal to a demodulated signal 3 by using methods known in the art and not to be described here in more detail. The demodulated signal 3 is forwarded to a data decoder 4 that reconstructs the data included in the above mentioned data channel by still using methods known in the art, depending on the coding methods used in the transmitting phase of the signal. The output is a decoded signal 5 that is forwarded both into the controller 6 and the measuring element 7. The measuring element 7 is constructed so that it can synchronize itself with the decoded signal and measure the amount of such errors present in the signal that most probably are caused by interferences on the transfer path. Typical errors of the decoded signal are bit errors that are detected by the measuring element 7 either by comparing the contents of a certain data frame with the checksum calculated therefrom or by detecting that a code word does not belong to a predetermined group describing allowed code words. There are numerous methods known in the art for detecting errors in a certain bit stream.

Based on the errors that the measuring element 7 has detected, it forms a parameter describing the quality of the signal. In its simplest form the parameter is one bit, the first value of it indicating that the quality is good and the second value of it indicating that the quality is bad. The criteria according to which the measuring element 7 determines whether the quality is good or bad can be chosen by testing and it can be e.g. a certain number of code words received correctly in succession, or a certain threshold value of the Bit Error Ratio (BER). Also more complicate embodiments can be proposed, in which the measuring element 7 describes the signal quality e.g. with two bits, whereby the bit combination 00 can correspond to the best signal quality, 01 reasonably good, 10 reasonably bad and 11 bad. Also other representation forms of the quality are possible. The quality measurement can include averaging and other mathematical measures, through which the best possible statistical equivalence between the parameter describing the quality and the signal itself is aimed at.

The measuring element 7 delivers the parameter describing the quality to the controller 6, the task of which is on one hand to process the decoded signal for the use and on the other hand to control the frequency of the radio receiver 1 based on the signal given by the measuring element 7. Algorithms, based on which the controller 6 changes the mixer frequency used by the radio receiver 1, is described in more detail later.

The receiving device illustrated in FIG. 1 can be e.g. a selective call receiver the kinds of which are generally used in paging devices. For transmitting the received information to the user, the device in that case comprises, in addition to the parts shown in FIG. 1, at least data storage means, alarm means and a display or some other expressing means, by means of which it presents data in a form observed by the user. It can also be a radio broadcast receiver, whereby the above mentioned data channel typically comprises data modulated to a certain subcarrier. Methods for connecting data to a broadcast type transmission known by a man skilled in the art are e.g. RDS (Radio Data System), MBS (MoBile Sokning) and SWIFT (System for Wireless Information Forwarding and Teledistribution). A radio broadcast receiver comprises in a way known in the art, in addition to the blocks shown in FIG. 1, means for presenting the transmitted program to the user in an audio and/or video form. Some receivers that are meant e.g. to be used in a car are composite audio and data receivers, whereby they can present both acoustical and data transferred information to the user.

Let us assume that the controller 6 has tuned the radio receiver 1 so that the center frequency of its receiving band is f0, in other words, the radio receiver is tuned to frequency f0. Let us further assume that the controller 6 is able to tune the radio receiver in steps of a certain dimension, whereby the following higher receiving frequency is f0+1 and the next frequency is f0+2. Correspondingly, the following frequency lower than f0 is f0−1 and the next lower frequency is f0−2. The frequencies have been in that case presented in such scaled units, that the tuning step, in other words, the difference between two adjacent frequencies is of the magnitude of one unit. The stepwise tuning of the radio receiver by means of an electric control signal is technology known in the art. According to the method in accordance with the invention, when the radio receiver is tuned on frequency f0, the device monitors the quality of the signal, in addition to the frequency in question, also at least on frequencies f0+1 and f0−1. The controller 6 gets through the measuring element 7 the information on the signal quality on all measured channels and, based on this information, decides to keep the tuning unchanged or to change it. In the following table, each line corresponds a certain decision event, where the controller gets the information according to the code letters on the line to be processed and selects the frequency given in the first column from the right to be the new frequency. The line numbers are not related with the reference numbers used in the figures. The abbreviations Q1–Q5 mean the quality measurement on different frequencies (Q=quality), the code letter G means good signal quality and code letter B means bad signal quality.

| Line Number | Measurements | | | | | New frequency |
|---|---|---|---|---|---|---|
| | Q5 (f0 − 2) | Q2 (f0 − 1) | Q3 (f0) | (Q1 (f0 + 1) | Q4 (f0 + 2) | |
| 0 | | G | G | G | | f0 |
| 1 | | B | G | G | | f0 + 1 |
| 2 | | G | B | G | | f0 |
| 3(a) | | B | B | G | G | f0 + 1 |
| 3(b) | | B | B | G | B | f0 |
| 4 | | G | G | B | | f0 − 1 |
| 5 | | B | G | B | | f0 |
| 6(a) | G | G | B | B | | f0 − 1 |
| 6(b) | B | G | B | B | | f0 |
| 7 | | B | B | B | | f0 |

On the line nr. 0 the signal quality is good both on the tuned frequency f0 and on both sides of it. The radio receiver is probably tuned in the middle of a good audible frequency band, so that there is no need to change the tuning. On line 1, the measurement gives cause for assuming that the best frequency band is slightly above the frequency f0, so that the tuning will be raised by one step. On line 2 the bad signal quality in the middle of two frequencies of good quality is probably caused by temporary interference, so that the frequency will not be changed. On lines 3a and 3b the controller notices that the signal quality is bad not only on the tuned frequency f0, but also below it, whereby the signal quality measurement will be extended to the frequency f0+2. The signal quality on this frequency determines the new frequency as described in the table. Line 4 is a mirror image of line 1 and on line 5 the signal quality is good only on the frequency f0, so that it is not profitable to tune the receiver on any other frequencies. Lines 6a and 6b are mirror images of lines 3a and 3b. On line 7 the signal quality is throughout bad, which refers to an interference independent of frequency, whereby the tuning will not be corrected.

The table described above is not the only possible conclusion table to be applied to in order to optimize the quality of the received signal in accordance with the present invention. If the measuring element 7 describes the signal quality on a scale with multiple steps, the table will be much more complicated. Based on the information given by the present patent application, a man skilled in the art is even in that case, however, able to make up a table that describes the operation of the controller for adjusting the tuning in order to optimize the signal quality in accordance with the present invention. In one alternative embodiment of the present invention, the measuring element first measures the signal quality only on one additional frequency in addition to the frequency f0. In still one further alternative embodiment, the frequencies, the qualities of which are at first measured by the measuring element, are not directly adjacent.

Figure 2:
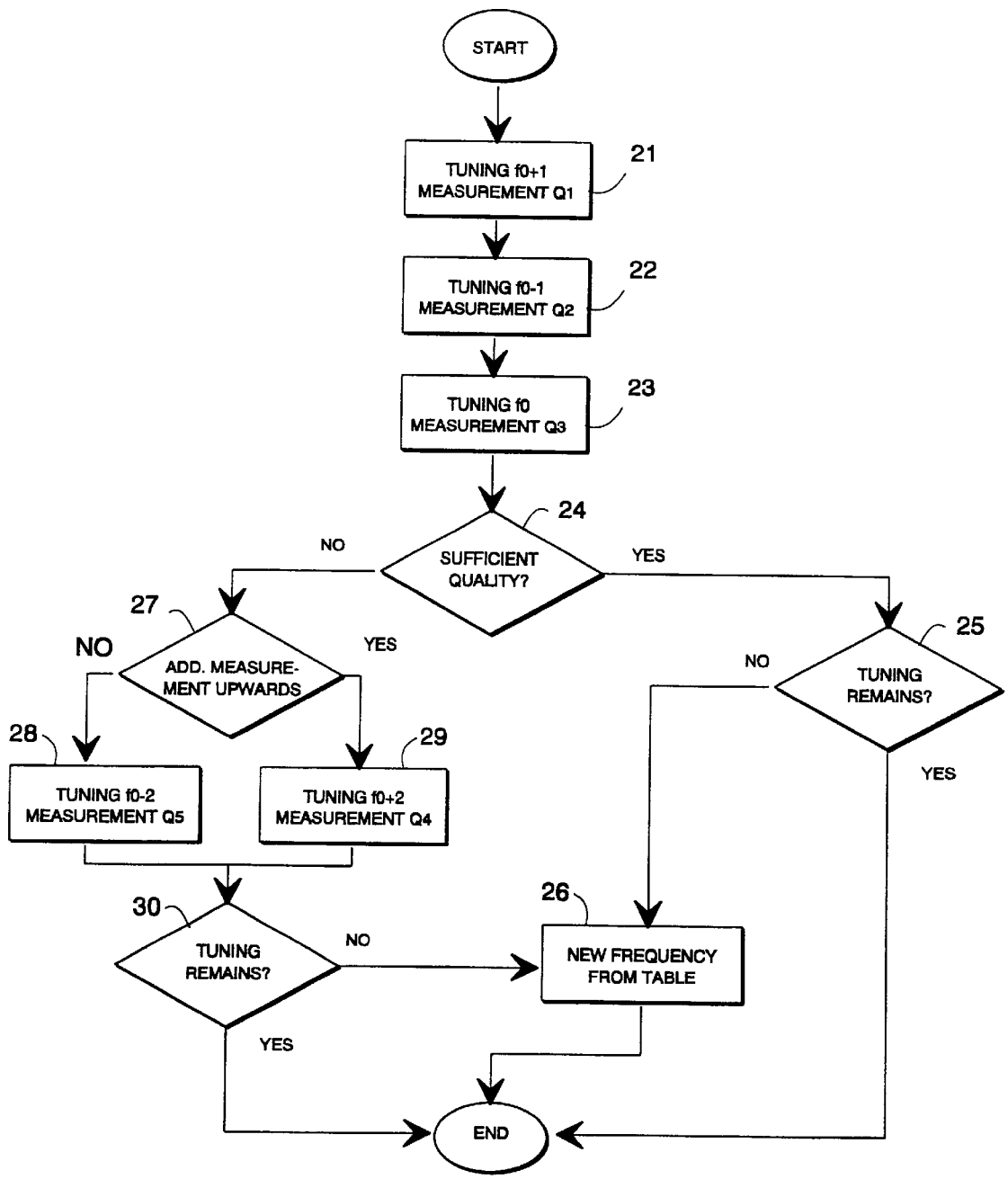
FIG. 2 shows as a flow diagram a method in accordance with the present invention.

FIG. 2 shows a flow diagram that describes the operation of the controller more generally than the table described above. In phases 21, 22 and 23 the controller measures the signal quality on channels f0+1, f0−1 and f0 or on some other group of channels regarded as suitable. In phase 24 the controller examines, whether the information produced by the outcome of the measurement is sufficient or if more measurement results have to be taken from other channels (when using the above described table the controller ends up to the yes-branch of phase 24, if there are two, three or no Gs among the measuring outcomes Q1, Q2 and Q3, or if only the measuring outcome Q3 is G). After having ended up to the yes-branch, the controller further examines in phase 25, whether the distribution of the measuring outcomes expressing good quality gives cause for returning 26 (compare lines 1 and 4 in the table described above) or whether the execution of the program this time results in keeping the tuning unchanged (compare lines 0, 2, 5 of the table described above). In case the controller in phase 24 ended up to the no-branch, it decides at first, to which direction the measurement has to be expanded (phase 27) and makes the required additional measurement (phases 28 and 29). After that the program examines in phase 30, whether the distribution of the measuring outcomes gives cause to returning 26 (lines 3a and 6a of the table) or whether the execution of the program this time results in keeping the tuning unchanged (lines 3b and 6b of the table).

The present invention is advantageous with respect to the prior art, because the tuning of the receiver will be optimized so that the desired signal reaches its destination in all circumstances in the best possible way. Because the signal quality is determined from the decoded signal, the invention considers all tolerance and interference factors. Manufacturing costs are decreased by the invention because there is no need to use any expensive precision components in the receiver. A receiver in which the method in accordance with the invention is applied to, can even allow certain drifting of characteristics caused by warming up and/or aging of components or differences in characteristics caused by manufacturing tolerances, because the frequency correction in accordance with the invention always adapts to different situations respectively. The method and device in accordance with the present invention react immediately, when errors are detected in the received signal, and this reaction threshold can even be automatically adjustable or can be set by the user or the data transfer network. The fast reaction prevents the signal from getting so bad that no correction measures would be effective anymore. The functional phases required by the invention can be easily implemented, e.g. by programming them to commands that are effected by the microprocessor controlling the operation of the radio receiver or some other electric controller. The invention is well applicable to quite different receiving devices on different frequency bands.

What is claimed is:

1. A method for improving the quality of the reception of data transmitted in a certain data channel of a received signal using a receiving device comprising a digital radio receiver to be tuned step by step to certain frequencies associated with said certain data channel, comprising the steps of:

demodulating and decoding said certain data channel of the received signal, said certain data channel transmitting said data in a digital form, measuring the quality of said data in a digital form on one certain frequency and at least on one further certain frequency of said certain frequencies, choosing said one further certain frequency so that tuning the receiver thereto requires a tuning step, and producing a decision based on the results of the quality measurement on said digital data as to, whether said radio receiver will be kept tuned to the one certain frequency, whether it will be tuned to said one further certain frequency, or whether the quality will be further measured on another of said certain frequencies before the decision is made about returning the receiver.

2. A method in accordance with claim 1, wherein said one certain frequency is a first frequency, said one further certain frequency is a second frequency, and said another certain frequency is a third frequency, and the quality of the received signal is measured on said first frequency (f0) and on said second frequency (f0+1) in said radio receiver that is a frequency one tuning step higher than said first frequency, and on said third frequency (f0−1) in said radio receiver that is a frequency one tuning step lower than said first frequency.

3. A method in accordance with claim 2, wherein the quality of the received signal is measured on each certain frequency by using a two-step scale, according to which the quality is either good (G) or bad (B).

4. A method in accordance with claim 3, that comprises steps as mutually exclusive alternatives in which:

in case the results of the quality measurement on said first, second and third frequencies show that the quality of the signal is good only on said second frequency, the signal quality is additionally measured on a certain fourth frequency (f0+2), that in said radio receiver is a frequency two tuning steps higher than said first frequency;

in case the results of the quality measurement on said first, second and third frequencies show that the quality of the signal is good only on said third frequency, the signal quality is additionally measured on a certain fifth frequency (f0−2), that in said radio receiver is a frequency two tuning steps lower than said first frequency, and in other cases the decision on returning the radio receiver is made only based on quality measurement concerning said first, second and third frequency.

5. A method in accordance with claim 4, wherein the decision on returning of the radio receiver is made based on the following table:

| Line Number | Measurements | | | | | New frequency |
| --- | --- | --- | --- | --- | --- | --- |
| | Q5 (f0 − 2) | Q2 (f0 − 1) | Q3 (f0) | (Q1 (f0 + 1) | Q4 (f0 + 2) | |
| 0 | | G | G | G | | f0 |
| 1 | | B | G | G | | f0 + 1 |
| 2 | | G | B | G | | f0 |
| 3(a) | | B | B | G | G | f0 + 1 |
| 3(b) | | B | B | G | B | f0 |
| 4 | | G | G | B | | f0 − 1 |
| 5 | | B | G | B | | f0 |
| 6(a) | G | G | B | B | | f0 − 1 |
| 6(b) | B | G | B | B | | f0 |
| 7 | | B | B | B | | f0 |

6. A method in accordance with claim 1, characterized in that the signal quality on a certain frequency is regarded as good when the value of the bit error ratio of said data in a digital form is smaller than a certain first threshold value.

7. A method in accordance with claim 1, characterized in that the signal quality on a certain frequency is regarded as good when said data in a digital form comprises a certain amount of code words received correctly in succession.

8. A receiving device for receiving a radio signal that comprises at least one digital data channel having certain frequencies associated therewith, said receiving device comprising:

a digital radio receiver to be tuned step by step on said certain frequencies for receiving and demodulating a radio signal containing digital data on said one digital channel, a data decoder for decoding said digital data from a radio signal demodulated by said radio receiver, a controller for processing said digital data and for tuning said radio receiver, and a measuring element for measuring quality from said decoded digital data on one certain frequency and at least on one further certain frequency chosen so that tuning the receiver thereto requires a tuning step, and for delivering a parameter describing said quality to said controller for determining the tuning of said radio receiver on said one digital channel.

9. A receiving device in accordance with claim 8, wherein said device comprises a selective call receiver.

10. A receiving device in accordance with claim 8, wherein said one certain frequency is a first frequency, said one further certain frequency is a second frequency, and another certain frequency is a third frequency, and said measuring element comprises means for measuring the quality of said decoded digital data from the received signal on said first frequency (f0), and on said second frequency (f0+1) in said radio receiver that is a frequency one tuning step higher than said first frequency, and on said third frequency (f0−1) in said radio receiver that is a frequency one tuning step lower than said first frequency.

11. A receiving device in accordance with claim 10, wherein said means for measuring the quality measures the quality of the received signal on each certain frequency by using a two-step scale, according to which the quality is either good (G) or bad (B).

12. A receiving device in accordance with claim 11, wherein said measuring element comprises means for selecting mutually exclusive alternatives in delivering said parameter according to the quality measurements comprising:

in the case where the results of the quality measurement on said first, second and third frequencies show that the quality of the signal is good only on said second frequency, the signal quality is additionally measured on a certain fourth frequency (f0+2), that in said radio receiver is a frequency two tuning steps higher than said first frequency;

in the case where the results of the quality measurement on said first, second and third frequencies show that the quality of the signal is good only on said third frequency, the signal quality is additionally measured on a certain fifth frequency (f0−2), that in said radio receiver is a frequency two tuning steps lower than said first frequency, and in other cases the decision on returning the radio receiver is made only based on quality measurement concerning said first, second and third frequency.

* * * * *